(12) United States Patent
Crist

(10) Patent No.: US 7,372,259 B1
(45) Date of Patent: May 13, 2008

(54) MAGNETOMETER TRANSDUCER SAMPLING FRONT-END AMPLIFIER AND PROCESSOR

(75) Inventor: Scott D. Crist, Naples, FL (US)

(73) Assignee: Alliant Techsystems Inc., Edina, MN (US)

( * ) Notice: Subject to any disclaimer, the term of this patent is extended or adjusted under 35 U.S.C. 154(b) by 0 days.

(21) Appl. No.: 11/758,825

(22) Filed: Jun. 6, 2007

(51) Int. Cl.
G01R 33/02 (2006.01)
(52) U.S. Cl. ..................................... 324/244
(58) Field of Classification Search ................ 324/244, 324/246, 247, 249, 251–258
See application file for complete search history.

(56) References Cited

U.S. PATENT DOCUMENTS 3,319,160 A * 5/1967 Wood et al. ................. 324/226

* cited by examiner

*Primary Examiner*—Reena Aurora
(74) *Attorney, Agent, or Firm*—Vidas, Arrett, and Steinkraus

(57) ABSTRACT

A magnetometer transducer sampling front-end amplifier (stand alone option) and processor including a transducer, a passive low pass filter, a differential or single-ended amplifier, an output capacitor and discharge control, a voltage comparator, a duty cycle control logic block, a sampling clock and PWM logic block, a gated current source, a system clock and decimators block, and an interval counting detection processor with a target detection output to a system controller.

25 Claims, 3 Drawing Sheets

MAGNETOMETER TRANSDUCER SAMPLING FRONT-END AMPLIFIER AND PROCESSOR

CROSS-REFERENCE TO RELATED APPLICATIONS

Not Applicable

STATEMENT REGARDING FEDERALLY SPONSORED RESEARCH

Not Applicable

FIELD OF THE INVENTION

The present invention relates to passive search coil magnetometers, and, more particularly, to a magnetometer transducer sampling front-end amplifier and processor. The present invention is also applicable to active (i.e. excitation power) bridge type magnetometer transducers such as giant magneto resistive (GMR) and spin dependent tunneling (SDT) integrated circuits.

BACKGROUND OF THE INVENTION

Search coil magnetometer attributes have been exploited for years in low frequency (i.e. usually frequencies less than 2 Hz) ferrous target sensor applications that do not require detection of absolute magnetic field (H) values, but only very small induced changes, or deltas, as the target translates by the sensors static location. Search coil magnetometers operate using a passive transducer that requires no excitation power because the time changing magnetic H field to be detected directly induces a voltage across its coil. The induced voltage varies in accordance with the formula $E=KdH/dt$, where E is voltage, H is the magnetic field strength and K is the coil sensitivity, usually expressed in terms of "volt-seconds per Oersted."

Traditionally, low noise base-band front-end amplifiers, or preamplifiers, have been used to increase low coil output voltage from a search coil magnetometer to usable signal processing levels. Such traditional approaches employ complex chopper stabilized amplifiers and low-frequency baseband preamplifier designs in various low-noise configurations and topologies. Conventionally, low pass filtering is employed to flatten and band-limit coil output signal rate characteristics (dH/dt) in order to preserve in-band dynamic range capabilities. A dominant pole is often incorporated directly at the coil using the coil's output resistance. Unfortunately, base-band preamplifiers exhibit a significant level of 1/f noise, which significantly degrades system sensitivity at the lowest frequencies of interest, which are often 0.1 Hz or less.

In contrast to conventional approaches, the present invention provides a less complex sampling low noise front-end amplifier architecture that substantially eliminates 1/f noise problems prevalent in traditional base-band low noise preamplifiers. As a result, improved sensor performance is essentially limited only by noise generated by the transducer coil winding(s), or bridge element(s).

The art referred to and/or described above is not intended to constitute an admission that any patent, publication or other information referred to herein is "prior art" with respect to this invention. In addition, this section should not be construed to mean that a search has been made or that no other pertinent information as defined in 37 C.F.R. § 1.56(a) exists.

All US patents and applications and all other published documents mentioned anywhere in this application are incorporated herein by reference in their entirety.

Without limiting the scope of the invention, a brief summary of some of the claimed embodiments of the invention is set forth below. Additional details of the summarized embodiments of the invention and/or additional embodiments of the invention may be found in the Detailed Description of the Preferred Embodiments below.

A brief abstract of the technical disclosure in the specification is provided as well for the purposes of complying with 37 C.F.R. § 1.72.

SUMMARY OF THE INVENTION

The invention provides a magnetometer transducer sampling front-end amplifier and processor having reduced 1/f noise.

In at least one embodiment, the magnetometer transducer has a transducer output, the transducer selected from the group consisting of passive transducers and active transducers. A passive low pass filter is connected to the transducer output, the low pass filter including a filter output, and the low pass filter producing a signal with a baseband bandwidth. A current modulated differential pair amplifier having a first input is connected to the filter output, the differential pair amplifier also including a current source input and an amplifier output. The amplifier output has a frequency. An output capacitor and discharge control having a first control input is connected to the amplifier output, the output capacitor and discharge control further having a second control input and having a control output. The output capacitor and discharge control comprises a load capacitor, resistor, and switch, the load capacitor, resistor, and switch being connected to the amplifier output. A voltage comparator is connected to receive the control output, the voltage comparator including a reference voltage and having a comparator output. A duty cycle control logic block is connected to receive the comparator output, the duty cycle control logic block having a duty cycle system clock input. A voltage comparator input is connected to receive the voltage comparator output, and includes a control logic output. A sampling clock and pulse width modulation (PWM) logic block having a first sampling clock input is connected to receive the control logic output, the sampling clock and PWM logic block further having a second sampling clock input and a sampling clock output. A gated current source, having a current source input and a low duty cycle, is connected to receive the sampling clock output. The gated current source also has a current source output connected to the differential pair amplifier current source input. The gated current source provides the current modulation to the differential pair amplifier, and the gated current source has a Nyquist frequency and a sampling frequency. The Nyquist frequency is at least 50% of the sampling frequency. A system clock and decimators block has a first system clock output and a second system clock output is connected to the duty cycle system clock input. An interval counting detection processor, having a target detection output, is connected to receive the first system clock output.

In some embodiments, the magnetometer transducer has a transducer output, the transducer selected from the group consisting of passive transducers and active transducers. A passive low pass filter is connected to the transducer output, the low pass filter including a filter output, and the low pass filter producing a signal with a baseband bandwidth. A current modulated differential pair amplifier having a first input is connected to the filter output, the differential pair amplifier also including a current source input and an amplifier output. The amplifier output has a frequency. An active integrator and discharge control having a first control input is connected to the amplifier output, and having a second control input and having a control output. A voltage comparator is connected to receive the control output, the voltage comparator including a reference voltage and having a comparator output. A duty cycle control logic block is connected to receive the comparator output, the duty cycle control logic block having a duty cycle system clock input. A voltage comparator input is connected to receive the voltage comparator output, and includes a control logic output. A sampling clock and pulse width modulation (PWM) logic block having a first sampling clock input is connected to receive the control logic output, the sampling clock and PWM logic block further having a second sampling clock input and a sampling clock output. A gated current source, having a current source input and a low duty cycle, is connected to receive the sampling clock output. The gated current source also has a current source output connected to the differential pair amplifier current source input. The gated current source provides the current modulation to the differential pair amplifier, and the gated current source has a Nyquist frequency and a sampling frequency. The Nyquist frequency is at least 50% of the sampling frequency. A system clock and decimators block has a first system clock output and a second system clock output is connected to the duty cycle system clock input. An interval counting detection processor, having a target detection output, is connected to receive the first system clock output.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

BRIEF DESCRIPTION OF THE DRAWINGS

A detailed description of the invention is hereafter described with specific reference being made to the drawings.

DETAILED DESCRIPTION OF THE PREFERRED EMBODIMENTS

While the invention will be described herein with respect to certain specific useful embodiments, it will be understood that these examples are by way of illustration and that the invention is not limited by these examples.

Before going into a detailed description of each stage of the present invention, a brief overview of the basic theory of operation would be helpful. In one particular embodiment a passive search-coil magnetometer is used. As the magnetic field changes (dH/dt), a current and an electromotive force (emf) are induced in the search-coil. The passive search coil transducer converts the current into a voltage which can be measured to determine the changing magnetic field. However, because the voltage signal is extremely weak, it must first be amplified.

Figure 1:
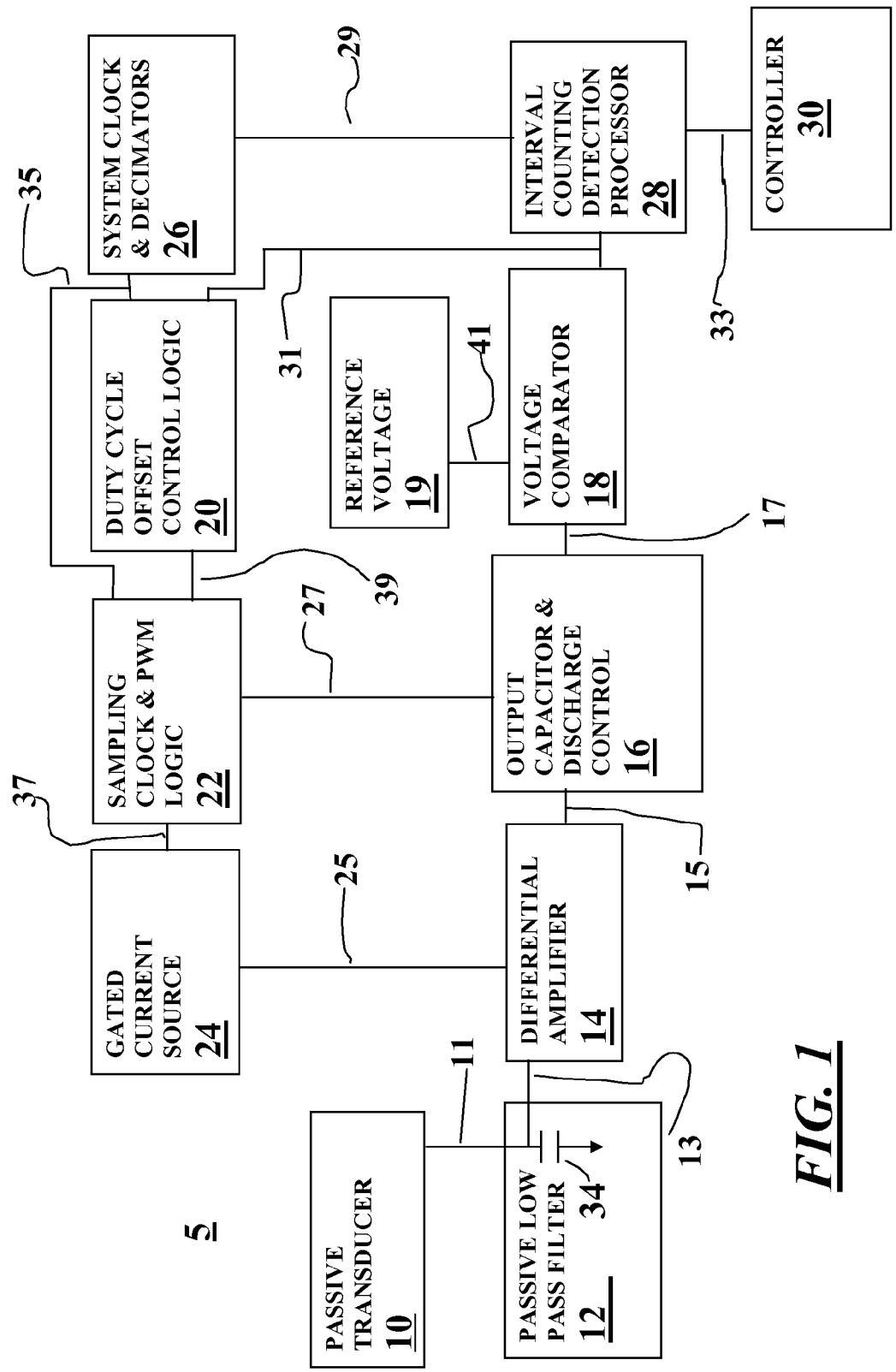
FIG. 1 illustrates a schematic block diagram of a magnetometer transducer sampling front-end amplifier and processor constructed in accordance with one example of the present invention.

In the embodiment depicted in FIG. 1, the passive transducer output signal 11 is fed into a passive low pass filter 12 to band-limit the output signal 11. The band-limited signal 13 from the filter 12 is fed into the differential pair amplifier 14. A differential pair amplifier has two inputs, and is used to amplify the difference between two input signals. This is referred to as the normal mode. When there is no difference between the signals, such as when there is noise induced equally between the two inputs, the differential pair amplifier is operating in a common-mode. An ideal differential pair amplifier would reject all common-mode signals (noise) and amplify only the normal mode signals. However, in reality some noise will be amplified. The level of performance of a differential pair amplifier is measured by the ratio of its response to normal-mode signals to its response to common mode signals. This is referred to as the common-mode rejection ratio (CMRR). A high CMRR indicates a quality differential pair amplifier.

The band-limited signal 13 from the filter 12 is fed into one of the differential pair amplifier 14 inputs and a reference voltage (usually ground) is fed into the second differential pair amplifier 14 input. In a common embodiment of a differential pair amplifier, a bipolar junction transistor (BJT) combination is used (npn or pnp) (although in other embodiments, field-effect transistors (FETs) are used.) A novel aspect of the application involves connecting a gated current source to the emitter connections of the differential pair amplifier 14. Referring specifically to pnp-transistors, the emitters of the two BJTs are tied together and the gated current source is connected from the emitters to $+V_{CC}$ (the positive supply rail). Using a current source will greatly reduce the common mode gain of the differential amplifier, thereby improving the CMRR.

The amplified output of the differential amplifier is connected to an output capacitor, resistor, and an electronic switch (e.g. a MOSFET), referred to here as the output capacitor and discharge control. In one embodiment, the capacitor, resistor, and switch are connected in parallel. Both the output capacitor and discharge control and the gated current source are controlled by the sampling clock and pulse width modulation (PWM) logic. Specifically, the sampling clock and PWM logic will "gate" the current source on and off, thereby providing a sampling rate to the differential pair amplifier. When the gated current source is on, the sampling clock and PWM logic opens the electronic switch, allowing the sampled output of the differential pair amplifier to charge the capacitor. When the gated current source is off, the parallel resistor discharges the capacitor at a rate typically much less than the charging rate.

The output from the output capacitor and discharge control is connected to a voltage comparator. As the capacitor discharges, the voltage comparator compares the capacitor voltage to a reference voltage (also connected to the voltage comparator) and switches when the capacitor voltage reaches the reference voltage. The system clock, duty cycle control logic, and the PWM logic are connected such that the voltage comparator outputs a pulse-width modulated signal whose width is a measure of the analog input signal magnitude.

The PWM signal is input into the interval counting detection processor. The interval counting detection processor compares the sample pulse counts over time. The pulse counts will increase as the magnitude of dH/dt increases, thus the interval counting detection processor performs the basic target detection logic function. A decimator provides proper sampling rates. Finally, the system controller further evaluates target signature "characteristics".

Figure 3:
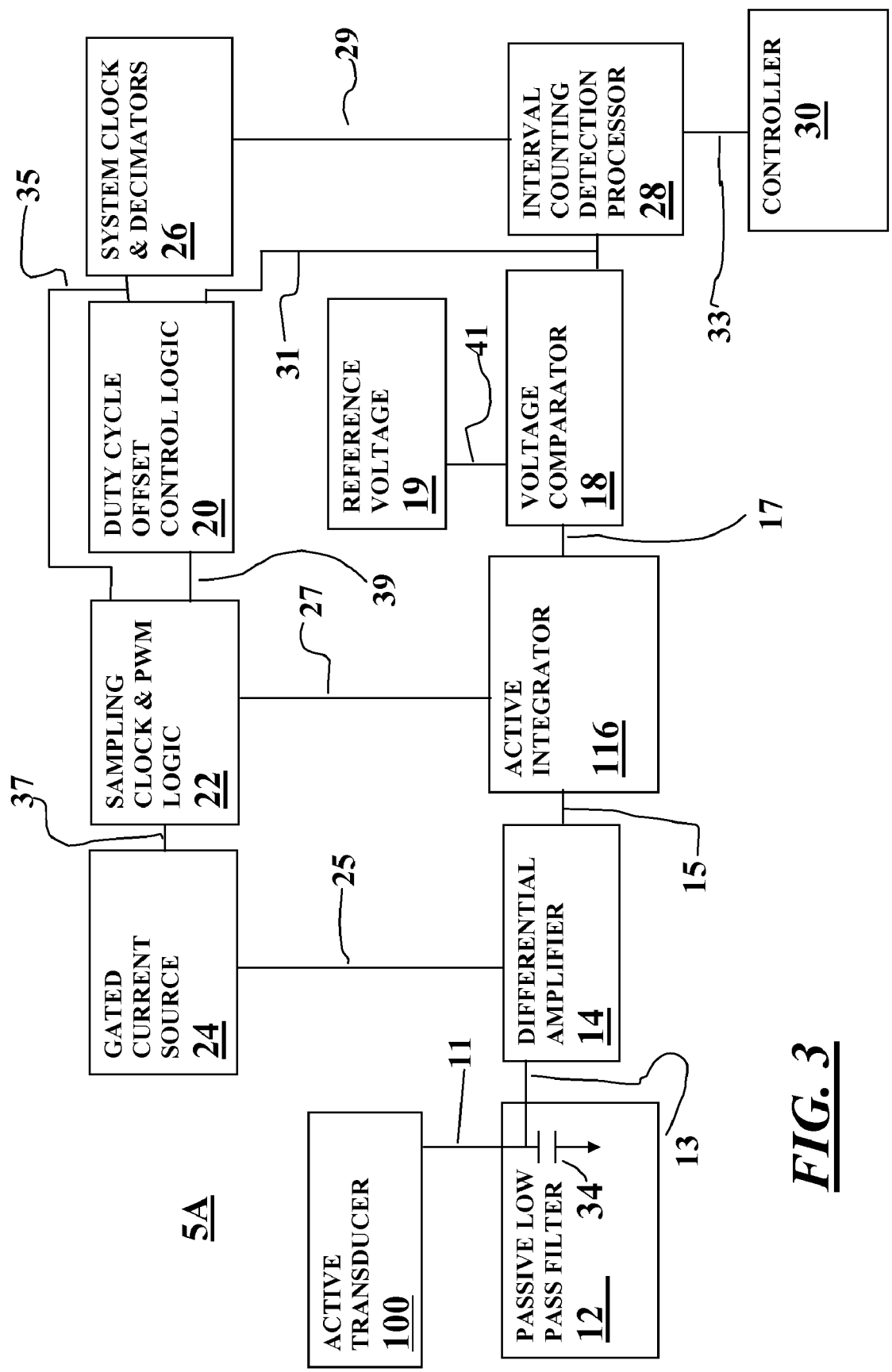
FIG. 3 illustrates a schematic block diagram of an alternate embodiment of a magnetometer transducer sampling front-end amplifier and processor constructed in accordance with another example of the present invention using an active transducer.

Referring now to FIG. 1, a schematic block diagram is shown of a magnetometer transducer sampling front-end amplifier and processor 5 constructed in accordance with one example of the present invention. The magnetometer transducer sampling front-end amplifier and processor 5 includes a passive transducer 10, a passive low pass filter 12, a differential amplifier 14, an output capacitor and discharge control 16, a voltage comparator 18, a duty cycle control logic block 20, a sampling clock and PWM logic block 22, a gated current source 24, a system clock and decimators block 26, and an interval counting detection processor 28 with a target detection output 33 to a system controller 30. The passive transducer 10 may advantageously comprise a search coil transducer. Optionally, an active integrator 116, as best shown in FIG. 3, is employed in magnetometer transducer sampling front-end amplifier and processor 5 in place of the output capacitor discharge and control 16. In some embodiments, the active integrator comprises an op-amp, a resistor, and a capacitor, wherein the resistor is connected to the op-amp's inverting input, the capacitor is connected between the op-amp's inverting input and the op-amp's output, and the op-amp's non-inverting input is connected to a reference voltage. One of ordinary skill will recognize that there are a number of other methods of creating an active integrator.

As shown in the embodiment depicted in FIG. 1, the passive search coil transducer 10 has a transducer output 11. In one example embodiment, the passive transducer 10 includes a conventionally designed search coil transducer based on an air core or permeable core form. Those skilled in the art having read this disclosure will understand that the intrinsic sensitivity physics is well known and can be controlled for optimizing performance when matched to a given amplifier topology. The present invention provides a low-noise sampling amplifier where the coil becomes the dominant system thermal noise source.

The passive low pass filter 12 is connected to the transducer output 11, and includes a filter output 13. In one example embodiment, the passive low pass filter 12 includes a simple high frequency roll-off capacitor 34 that is advantageously inserted at the output of the search coil transducer to limit out-of-band signals. For low Q transducers, the capacitor 34 combines with the coil resistance yielding first order roll-off characteristics. It is often desirable to set the roll-off corner at the lowest system operating frequency such that a so-called dominant pole is established for lowest noise bandwidth and flat flux response, which maximizes system dynamic range. In essence, the established dominant pole provides rate compensation.

The differential pair amplifier 14 has a first input 13 connected to the filter output 13. The differential pair amplifier 14 comprises a low noise bipolar junction transistor (BJT) differential pair amplifier including matched transistors Q1 and Q2. The BJT emitter connections are connected to a low duty cycle pulsed current source 24 whose sampling rate/frequency spectrum is at or above the appropriate Nyquist frequency and 1/f noise floor curve "knee." In some embodiments, a low noise field effect transistor (FET) differential pair common source amplifier is utilized. In that case, the FET sources are similarly connected to a low duty cycle pulsed current source 24, as described above.

Figure 2:
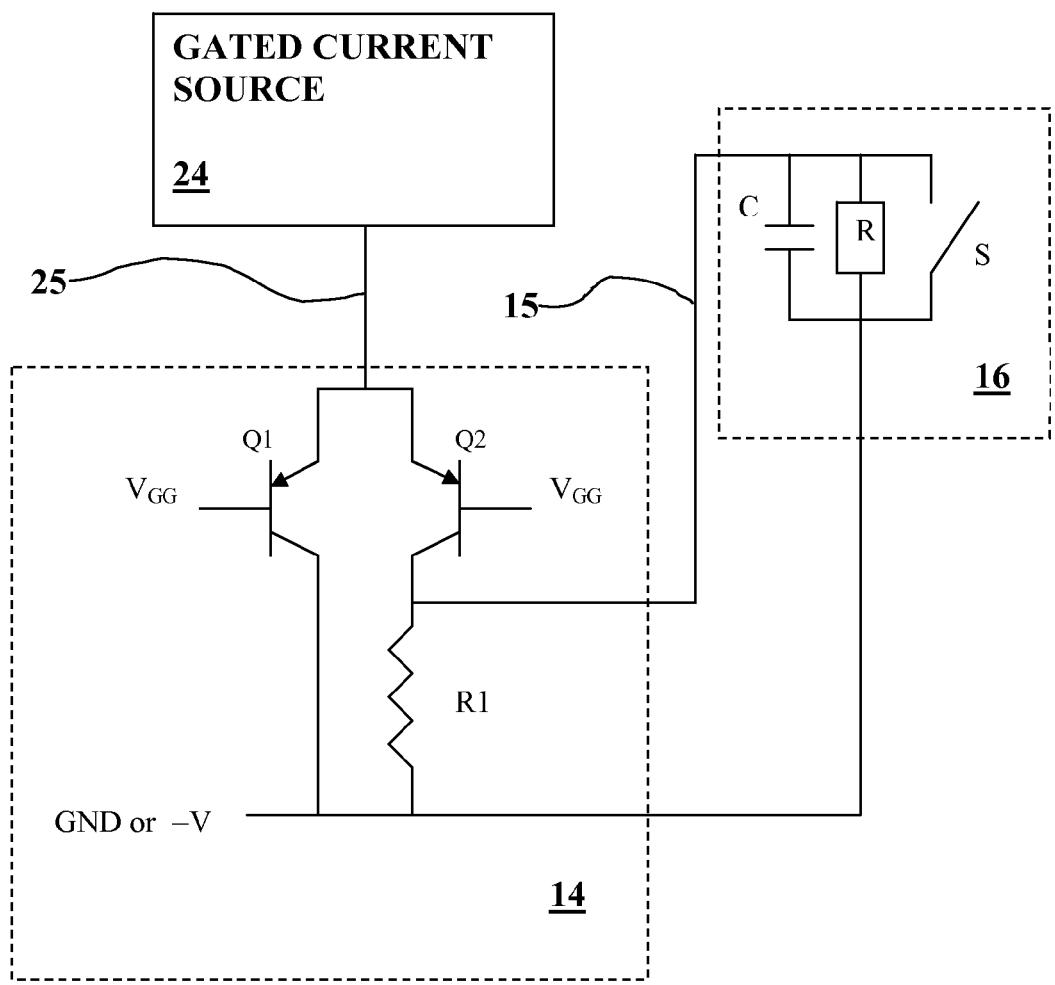
FIG. 2 illustrates a simplified schematic block diagram of one embodiment of a low noise bipolar junction transistor differential pair amplifier and an output capacitor and discharge control.

FIG. 2 depicts a simplified schematic block diagram of one embodiment of a differential amplifier 14 and an output capacitor and discharge control 16. In FIG. 2 a differential pair amplifier 14 using pnp BJT transistors is shown. However, as mentioned above, in other embodiments, FETs may be used. The matched pair of transistors (Q1 and Q2) has a single stage that provides both low noise transducer output signal gain and sampling simultaneously. The emitter (or source) junction is driven from the low noise gated current source 24 such that the stage is operating either at an optimum amplification low-noise, sampling, bias point for a given transducer, or, is completely off, thus sampling and amplifying the input signal simultaneously. Appropriate selection of the sampling time and rate effectively limits in-band noise performance contribution primarily to that of the transducer winding resistance since over-sampling can average out most of the out-of-band amplifier noise as well as eliminating any in-band 1/f noise contributions. The collector (or drain) load R1 for this stage determines the stage gain and will be described below. It should be noted that if higher gain is required, rather than using collector load R1, a differential to single-ended current mirror termination can be used. The front-end gain/sampling stage constructed in accordance with the present invention can be configured for single or split supply operation depending on system requirements.

In yet another embodiment, the differential amplifier 14 is operated with differential or single ended load(s), including a second stage, depending on system sensitivity requirements and power supply configuration. It should also be recognized that a single-ended amplifier stage may be utilized if performance requirements dictate.

The differential amplifier 14 also includes a current source input 25 and an amplifier output 15. The gated current source 24 provides an on-state bias/operating current for the front-end differential pair sampling amplifier. As with a conventional "DC" or base-band differential pair amplifier, its impedance or voltage compliance determines the power supply and common mode rejection capability of the stage. Also, it should have low noise characteristics for optimum sensor performance. In this sampling application, it will be gated on and off by the sampling clock and PWM control logic 22. A component ideally suited for this function is a low noise junction field effect transistor (JFET) in a shorted gate-source connection. A source terminal bias resistor may be included to set the proper operating current, thus eliminating the need for selected parts for a desired bias current value.

Next, the output capacitor and discharge control 16 has a first control input connected to the amplifier output 15, a second control input 27 and an output capacitor node 17. In one particular example of the present invention, the amplifier output 15 provides amplified sampling current(s) which is used to charge an output capacitor, or an active integrator, whose subsequent controlled discharge slopes are detected using simple comparator/clock cycle counting and digital signal processing techniques operating above the critical input noise floor.

In the embodiment depicted in FIG. 2, the output capacitor and discharge control 16 includes at least one paralleled network load including a capacitor C, resistor R, and electronic switch S (optional) connected to differential pair amplifier output 15. The electronic switch S may be implemented using a Metal-Oxide-Semiconductor Field Effect Transistor (MOSFET), for example. The capacitor is charged during each sample (e.g. as determined by a current pulse provided by gated current source 24) to a voltage determined by the input signal and gated current source levels. It should be noted that either differential or single ended network loads may be employed. The load determines the stage voltage gain and quantization resolution for each sample of the input signal.

Subsequently, the parallel resistor R controls the capacitor discharge rate such that the resulting sampling interval slope can be resolved by the voltage comparator 18 and pulse counting techniques. Resolution is determined by the sampling and pulse counting rates. DC restoration (optional) can be provided on a cycle per cycle basis by completely discharging the capacitor at the end of each sampling cycle or interval.

The voltage comparator 18 is used in conjunction with the duty cycle offset control logic 20, sampling clock and PWM logic 22, and system clock and decimators 26 to provide digital quantization of the amplified and sampled input signal dH/dt by producing a pulse-width modulated signal.

In one embodiment, as mentioned above, as the output capacitor discharges through the resistor, the voltage comparator 18 compares the capacitor discharge slope against a reference voltage 19. The reference voltage level is set for signal polarity symmetry. When the discharge slope reaches the reference voltage, the voltage comparator switches and outputs a signal 31. Properly connected, the voltage comparator 18, duty cycle control logic 20, and the PWM logic 22 convert the signal 31 into a digital signal whose output pulse width is a measure of the amplified and sampled input signal dH/dt. The system clock 26 provides timing for the duty cycle control logic.

In some embodiments, the duty cycle control logic block 20 includes logic that measures the long-term timing symmetry of the voltage comparator output pulse polarities within each sampling interval. If an asymmetrical condition is detected, correction is applied to the sampling clock and pulse width modulation (PWM) logic 22 to remove this offset condition. Offset is a common mode error, which affects the proper operating point, or bias point, of the front-end differential sampling amplifier and its load capacitor voltage.

In some embodiments, the sampling clock and PWM logic block 22 includes logic that provides the sampling rate and load capacitor discharge switch control of the front-end sampling differential amplifier. The offset error previously detected is used to modulate each sampling interval pulse width. The pulse width modulation technique controls the operating point of the amplifier.

In another embodiment of the present invention, an interval counting detection processor 28 is included. The magnitude of dH/dt increases as the distance between the search-coil magnetometer and the target (ferrous body) decreases, and the sample pulse counts increase as the magnitude of dH/dt increases. Thus, the interval counting detection processor performs the basic target detection logic function by evaluating the difference between sample pulse counts over time.

In some embodiments, a system clock and decimator 26 is further included. The system clock provides overall sensor clocking and functional synchronization as well as the necessary sampling interval resolution pulses. Also, suitable decimation is provided for proper sampling rates, target signature resolution, and input dynamic range.

Although, as mentioned above, the interval counting detection processor 28 provides the basic target detection logic function, target signature characteristics are further evaluated for validity by the system microcontroller logic 30.

FIG. 3 shows a schematic block diagram of an alternate embodiment of the present invention using an active transducer 100. Active transducers may comprise giant magnetoresistive integrated circuits as well as spin dependent tunneling integrated circuits. FIG. 3 also shows an active integrator 116 used in place of the output capacitor discharge and control 16 shown in FIG. 1. Of course, an output capacitor discharge and control 16 may also be used to supply input to the voltage comparator 18. The other components are constructed and arranged substantially as described above with reference to FIG. 1.

Therefore, embodiments of the present invention provide a low-noise front-end differential pair amplifier stage that is current modulated by a gated current source to provide both amplification and sampling of a low-frequency sensor transducer output such that subsequent digital processing techniques can be directly applied as appropriate for the intended application. The stage gain and subsequent digital resolution is determined by the amplifier stage load capacitor value and charging/discharging current ratios. And, the sampling time aperture is much less than the base-band period of interest such that amplification/operation is above the 1/f amplifier spectral noise curve knee. It should also be noted that the gated current source can be set for a 50% on-off duty cycle if the analog pickoff at node 17 is to be subsequently utilized for conventional base-band analog signal processing.

The above disclosure is intended to be illustrative and not exhaustive. This description will suggest many variations and alternatives to one of ordinary skill in this art. The various elements shown in the individual figures and described above may be combined or modified for combination as desired. All these alternatives and variations are intended to be included within the scope of the claims where the term "comprising" means "including, but not limited to".

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. A magnetometer transducer sampling front-end amplifier and processor comprising:
   a transducer having a transducer output, the transducer selected from the group consisting of passive transducers and active transducers;
   a passive low pass filter connected to the transducer output, the low pass filter including a filter output, the low pass filter producing a signal with a baseband bandwidth;
   an amplifier stage having a first input connected to the filter output, the amplifier stage also including a current source input and an amplifier output, the amplifier output having a frequency, the amplifier stage being current modulated;
   an output capacitor and discharge control having a first control input connected to the amplifier output, the output capacitor and discharge control further having a second control input and having a control output, the output capacitor and discharge control comprising a load capacitor, resistor, and switch, the load capacitor, resistor, and switch connected to the amplifier output;
   a voltage comparator connected to receive the control output, the voltage comparator including a reference voltage and having a comparator output;
   a duty cycle control logic block connected to receive the comparator output, the duty cycle control logic block having a duty cycle system clock input, a voltage comparator input connected to receive the voltage comparator output, and including a control logic output;
   a sampling clock and pulse width modulation (PWM) logic block having a first sampling clock input connected to receive the control logic output, and having a second sampling clock input, and having a sampling clock output;
   a gated current source having a current source input connected to receive the sampling clock output, the gated current source further having a low duty cycle, the gated current source further having a current source output, the current source output connected to the amplifier stage current source input, the gated current source providing the current modulation to the amplifier stage, the gated current source further having a Nyquist frequency and a sampling frequency, the Nyquist frequency being at least 50% of the sampling frequency;
   a system clock and decimators block having a first system clock output and a second system clock output connected to the duty cycle system clock input; and
   an interval counting detection processor connected to receive the first system clock output, and having a target detection output.

2. The amplifier and processor of claim 1, wherein the amplifier stage is selected from the group consisting of differential amplifiers and single-ended amplifiers.

3. The amplifier and processor of claim 1, further comprising a stage gain and digital resolution, wherein the load capacitor and resistor have a load capacitor discharge slope, and wherein the stage gain is determined by the load capacitor and the digital resolution is determined by the load capacitor discharge slope.

4. The amplifier and processor of claim 3, wherein the sampling frequency is much greater than the baseband bandwidth such that the frequency of the amplifier output is above a 1/f noise knee.

5. The amplifier and processor of claim 4, wherein the amplifier stage further comprises a current mirror load.

6. The amplifier and processor of claim 4, wherein the passive transducer comprises a search coil transducer has a core selected from the group consisting of air core and permeable core.

7. The amplifier and processor of claim 4, wherein the passive low pass filter comprises a high frequency roll-off capacitor coupled to the output of the passive transducer to limit out-of-band signals.

8. The amplifier and processor of claim 7, wherein the search coil transducer has a coil resistance, and wherein the capacitor combines with the coil resistance to set a roll-off corner at the lowest system operating frequency such that a dominant pole is established for lowest noise bandwidth and flat response to provide rate compensation.

9. The amplifier and processor of claim 8, wherein the amplifier stage comprises a matched pair of transistors.

10. The amplifier and processor of claim 9, wherein the load capacitor and resistor have a load capacitor discharge slope, and wherein the voltage comparator switches at a point on the load capacitor discharge slope when the reference voltage is reached.

11. The amplifier and processor of claim 10, wherein the interval counting detection processor provides basic target detection logic functions by evaluating the difference between sample pulse counts over time.

12. The amplifier and processor of claim 10, wherein the duty cycle control logic block comprises logic that measures the long term timing symmetry of the voltage comparator output pulse polarities within each sampling interval.

13. The amplifier and processor of claim 10 wherein the sampling clock and PWM logic block comprises logic that provides the sampling frequency and controls the switch of the output capacitor and discharge control.

14. The amplifier and processor of claim 10 wherein the gated current source provides an on-state bias/operating current for the amplifier stage.

15. A magnetometer transducer sampling front-end amplifier and processor comprising:
   a transducer having a transducer output, the transducer selected from the group consisting of passive transducers and active transducers;
   a passive low pass filter connected to the transducer output, the low pass filter including a filter output;
   an amplifier stage having a first input connected to the filter output, the amplifier stage also including a current source input and an amplifier output, the amplifier stage being current modulated;
   an active integrator and discharge control having a first control input connected to the amplifier output, the active integrator and discharge control further having a second control input and having a control output;
   a voltage comparator connected to receive the control output, the voltage comparator including a reference voltage and having a comparator output;
   a duty cycle control logic block connected to receive the comparator output, the duty cycle control logic block having a duty cycle system clock input, a voltage comparator input connected to receive the voltage comparator output, and including a control logic output;
   a sampling clock and pulse width modulation (PWM) logic block having a first sampling clock input connected to receive the control logic output, and having a second sampling clock input, and having a sampling clock output;

a gated current source having a current source input connected to receive the sampling clock output, the gated current source further having a low duty cycle, the gated current source further having a current source output, the current source output connected to the amplifier stage current source input, the gated current source providing the current modulation to the amplifier stage, the gated current source further having a Nyquist frequency and a sampling frequency, the Nyquist frequency being at least 50% of the sampling frequency;

a system clock and decimators block having a first system clock output and a second system clock output connected to the duty cycle system clock input; and an interval counting detection processor connected to receive the first system clock output, and having a target detection output.

16. The amplifier and processor of claim 15, wherein the amplifier stage is selected from the group consisting of differential amplifiers and single-ended amplifiers.

17. The amplifier and processor of claim 15 wherein the active transducer comprises circuitry selected from the group consisting of a giant magnetoresistive integrated circuit and a spin dependent tunneling integrated circuit.

18. The amplifier and processor of claim 15 wherein the passive low pass filter comprises a high frequency roll-off capacitor coupled to the output of the active transducer to limit out-of-band signals.

19. The amplifier and processor of claim 15 wherein the amplifier stage comprises a matched pair of transistors.

20. The amplifier and processor of claim 15 wherein the active integrator and discharge control comprises a load capacitor, resistor, and switch, the load capacitor, resistor, and switch connected to the amplifier output.

21. The amplifier and processor of claim 20, further comprising a stage gain and digital resolution, wherein the load capacitor and resistor have a load capacitor discharge slope, and wherein the stage gain is determined by the load capacitor and the digital resolution is determined by the load capacitor discharge slope.

22. The amplifier and processor of claim 20 wherein the voltage comparator provides basic target detection logic functions by evaluating the difference between sample pulse counts over time.

23. The amplifier and processor of claim 20 wherein the duty cycle control logic block comprises logic that measures the long term timing symmetry of the voltage comparator output pulse polarities within each sampling interval.

24. The amplifier and processor of claim 20 wherein the sampling clock and PWM logic block comprises logic that provides the sampling frequency and controls the switch of the active integrator and discharge control.

25. The amplifier and processor of claim 20 wherein the gated current source provides an on-state bias/operating current for the amplifier stage.

* * * * *